United States Patent [19]

Von Bargen et al.

[11] Patent Number: 4,602,243

[45] Date of Patent: Jul. 22, 1986

[54] ANALOG-TO-DIGITAL CONVERSION AND AVERAGING SYSTEM FOR AN OPTICAL ANALYZING INSTRUMENT

[75] Inventors: Kenneth P. Von Bargen, Berwyn Heights; Kenneth A. Taschner, Frederick, both of Md.

[73] Assignee: Pacific Scientific Company, Anaheim, Calif.

[21] Appl. No.: 489,022

[22] Filed: Apr. 27, 1983

[51] Int. Cl.[4] ............... H03K 13/02; H03K 5/00; G01J 3/511

[52] U.S. Cl. ............... 340/347 AD; 340/347 SH; 328/151; 356/418

[58] Field of Search ............... 340/347 AD, 347 SH, 340/347 P; 364/575, 811, 526; 356/416–419; 250/231 SE, 339; 328/151; 307/352–353

[56] References Cited

U.S. PATENT DOCUMENTS

| | | | |
|---|---|---|---|
| 3,622,765 | 11/1971 | Anderson | 364/575 |
| 3,879,724 | 4/1975 | McDonald | 340/347 AD |
| 4,194,183 | 3/1980 | Neuner et al. | 340/347 AD |
| 4,222,077 | 9/1980 | Yamada | 340/347 SH |
| 4,253,766 | 3/1981 | Funk | 356/418 |
| 4,443,108 | 4/1984 | Webster | 356/418 |
| 4,477,190 | 10/1984 | Liston et al. | 356/418 |
| 4,482,251 | 11/1984 | Saylor | 356/418 |
| 4,494,875 | 1/1985 | Schramm et al. | 356/418 |

Primary Examiner—Vit W. Miska
Attorney, Agent, or Firm—Lane and Aitken

[57] ABSTRACT

In an optical instrument which provides an analog signal representing the intensity of the reflected light from a sample, the sample is irradiated with narrow band wavelength light with the wavelength being repeatedly swept through a range of values to produce a repeating analog signal. Sampling pulses are produced simultaneously with the repeating analog signal to determine a sampling interval. An analog-to-digital converter is connected to receive the analog signal and converts the analog signal to a binary value several times in response to each sampling pulse. The binary values produced in response to each sampling signal are averaged and fed to a digital computer. In the digital computer, the received values are again averaged with other values produced in response to the sampling pulse produced at the same point in the scan of the wavelength irradiating the sample.

12 Claims, 2 Drawing Figures

FIG. I.

ANALOG-TO-DIGITAL CONVERSION AND AVERAGING SYSTEM FOR AN OPTICAL ANALYZING INSTRUMENT

BACKGROUND OF THE INVENTION

In optical analyzing instruments, a sample to be analyzed is irradiated with light and the amount of light reflected from the sample is transmitted through the sample at narrow band wavelengths and is detected by a photodetector to provide an analog signal, which is converted to a digital value and fed to a computer for analysis by arithmetical operations. In some of these instruments, such as those manufactured by the Gardner/Neotec Division of Pacific Scientific Company, the assignee of this invention, the narrow band wavelength is swept through a range of values and, as the wavelength changes, the resulting analog signal value for each increment of change of wavelength is converted to a digital value and fed to the computer. The accuracy of the measurement at each wavelength can be increased by repeating the measurement cycle several times, that is, by causing the narrow band wavelength to be scanned through its range of values several times and averaging the resulting digital values obtained at each incremental wavelength during successive measurement cycles.

There has now become available an analog-to-digital converter which can convert analog values to digital values at a much higher rate than was heretofore possible, thus making it possible to sample the input analog signal at a higher rate.

However, in order to make use of the samples provided at this higher rate, a substantially more expensive digital computer would be required. In addition, a higher sampling rate would be required necessitating running the scanning equipment at a higher speed or a more expensive system to generate sampling pulses which determine the sampling interval.

SUMMARY OF THE INVENTION

The present invention takes advantage of the capability of the analog-to-digital converter to provide the analog-to-digital conversion at a high rate to improve the signal-to-noise ratio of the resulting digital output signal without requiring any change in the digital computer and without requiring any change in the sample pulse generating system. In accordance with the present invention, each sampling pulse is fed to a sequencer, which then triggers the high speed analog-to-digital converter to repeatedly convert the input analog signal to a digital value several times in rapid succession, at the maximum rate that the analog-to-digital converter can carry out its conversion. The successive digital values obtained from one input sampling pulse are summed together to obtain an average value and then this average value is fed to the digital computer. Each average value fed to the computer will be produced in response to one sampling pulse and will correspond to a given input center wavelength for the band of wavelengths irradiating the sample during the interval that the digital values are being obtained. The average digital values for each center wavelength value obtained by the digital computer are then averaged over several measurement cycles in the digital computer to further improve the accuracy of the resulting signal. In this manner, a much more accurate signal with a much higher signal-to-noise ratio for each wavelength increment of input signal is obtained and stored in the digital computer.

Further objects and advantages of the present invention will become readily apparent as the following detailed description of the invention unfolds and when taken in conjunction with the following drawings.

DESCRIPTION OF A PREFERRED EMBODIMENT

Figure 1:
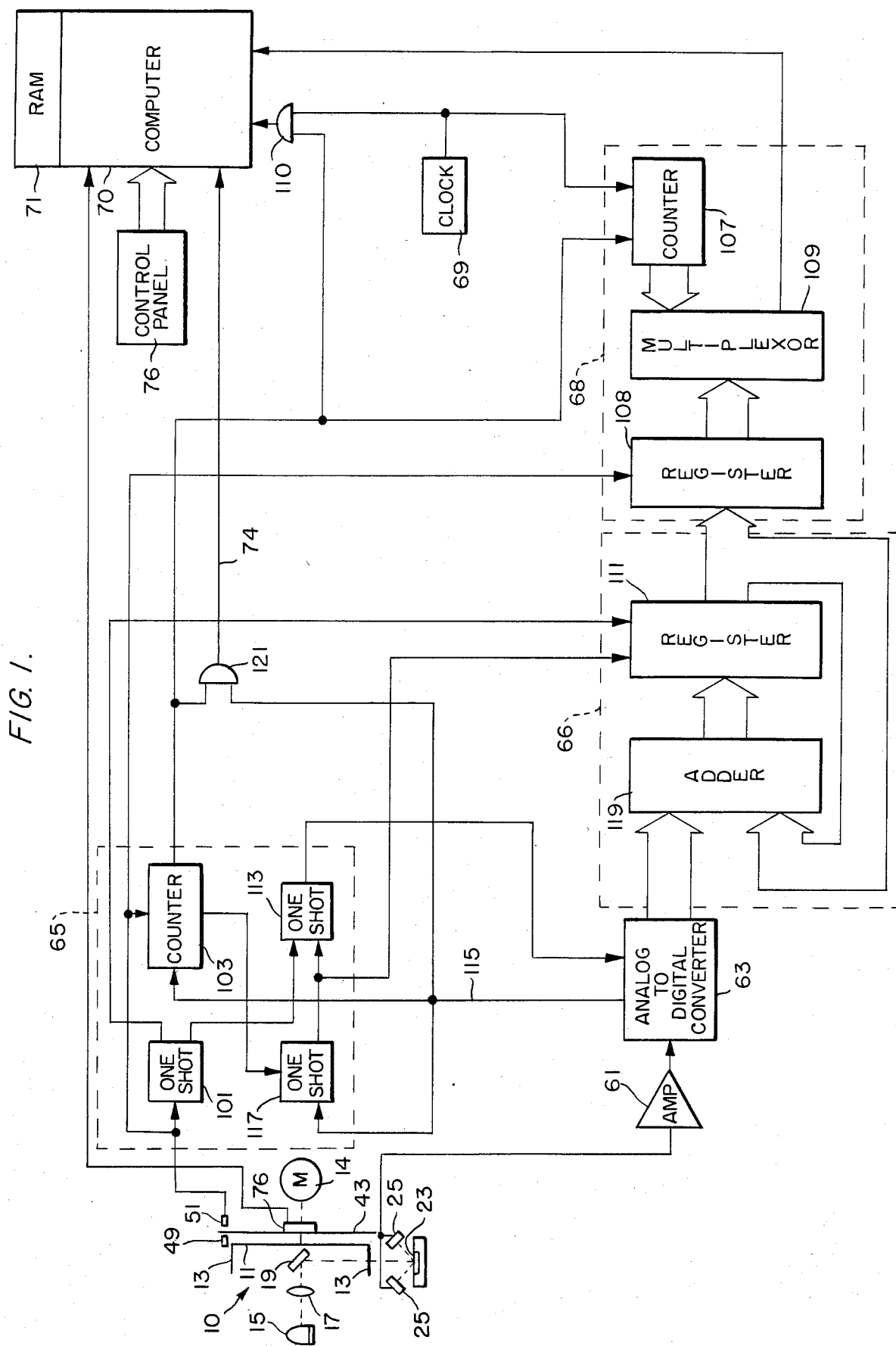
FIG. 1 is a block diagram illustrating the specific disclosed embodiment of the invention.

As shown in FIG. 1, the specific embodiment of the invention makes use of an optical system 10 which is shown schematically. This optical system 10 in this specific illustrated embodiment is the same as that employed in the Gardner/Neotec optical instrument sold under the name Continuous Process Analyzer Model 6100. The details of this optical system are substantially the same as the optical system disclosed in copending application Ser. No. 248,729 invented by Donald R. Webster, filed Mar. 30, 1981, and assigned to an affiliate of the assignee of the present invention. As described in the above-mentioned application, the optical system comprises a turntable 11 on which a plurality of interference filters 13 are mounted positioned in a cylindrical locus concentric with the axis of the turntable with the interference filters equally distributed about the axis of the turntable. The details of the turntable and filter arrangement are more specifically disclosed in U.S. Pat. No. 4,082,464 to Johnson. While the above-identified application and patent describes six interference filters mounted on the turntable, in the Model 6100 employed in the specific embodiment of the present invention, seven interference filters are mounted in the cylindrical locus. Instead of this system for irradiating the sample with a varying wavelength, other systems would be used such as disclosed in the Landa U.S. Pat. No. 4,285,596 or 4,264,205 or the Webster U.S. Pat. No. 4,040,747.

The turntable 11 is driven by a motor 14 to rotate the interference filters 13 continuously about the axis of the turntable 11. A wideband infrared light beam generated by a source 15 is collimated by a lens 17 and reflected by a mirror 19 into a beam passing through the cylindrical locus of the filters 13 onto a sample 23. The rotation of the turntable 11 brings the interference filters successively through the beam of light irradiating the sample 23 and causing the angle of each interference filter to vary with respect to the light beam as the filter moves through the beam of light. Each interference filter 13 transmits a very narrow bandwidth and the center wavelength transmitted by each interference filter will vary with the angle of the interference filter to the incident beam. Thus, as each interference filter moves through the beam of light and varies its angular orientation with respect to the beam of light, the center wavelength of the narrow band transmitted through the interference will be scanned continuously through a range of wavelengths. Each of the seven interference filters 13 is selected to scan through a different range of wavelengths preferably in the near infrared. The narrow band of light irradiating the sample 23 is reflected there by and the reflected light is detected by photodetectors 25 which generate a signal indicative of the intensity of the reflected light. From this signal, the sample can be analyzed. For example, the percentage of constituents in the sample can be determined. An example of a technique for analyzing a sample is disclosed in the above-mentioned Webster U.S. Pat. No. 4,040,747.

Figure 2:
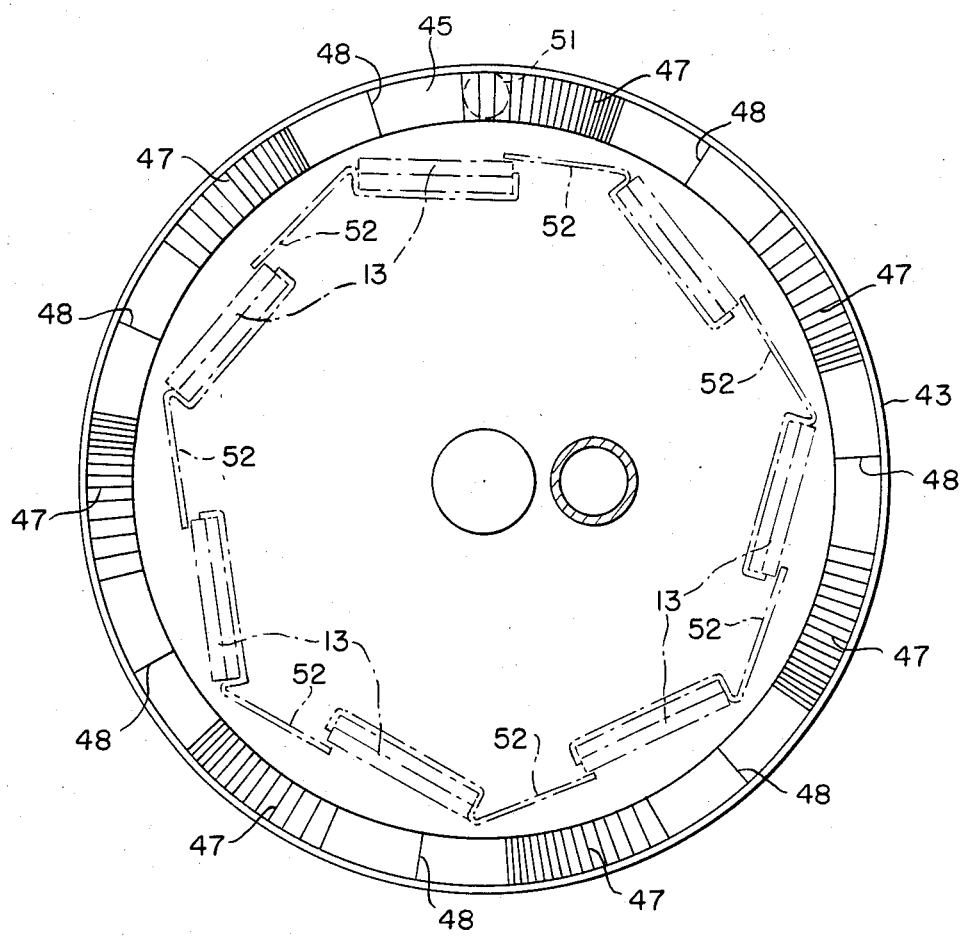
FIG. 2 illustrates an optical index wheel used to generate sample pulses for the system shown in FIG. 1.

An optical index wheel 43 is used to generate sampling pulses as the turntable 11 is rotated. The wheel 43 is mounted on the same shaft by which the motor 14 drives the turntable 11 to rotate in synchronism with the turntable 11. As shown in FIG. 2, which is a plan view of the wheel 43 with the array of interference filters 13 shown superimposed in phantom on the wheel 43, the index wheel 43 is provided with a transparent circular track 45 concentric about the axis of the turntable 11. The track is provided with opaque radial index marks 47 and a light source 49 is arranged to shine a beam of light through the track 45 to be detected by a photodetector 51. The photodetector 51 is masked to have a linear radial transparent slit so that as each index mark in the track 45 comes opposite the photodetector 51, it interrupts the light to the photodetector 51 and causes the photodetector 51 to generate a pulse. Alternatively, the track 45 could be opaque and the radial marks transparent.

As shown in FIG. 2, the index markings 47 are arranged in seven groups, one corresponding to each interference filter and each group of index markings will pass in front of the photocell as a given interference filter is passing through the beam of light over an angle of approximately 30°. In the spaces between each adjacent group of index markings 47, a single isolated index mark 48 is provided. Each interference filter, as described in U.S. Pat. No. 4,082,468, has an opaque plate 52 which blocks the light from the sample between interference filters. While each of the opaque plates passes through the beam of light, one of the isolated index marks 48 will pass over the photodetector 51 to generate a pulse to mark the spaces between the interference filters when the light is blocked by the plate 52. As disclosed in the above-mentioned copending application Ser. No. 248,729, the index marks of each group of marks 47 are unequally spaced so that the pulses generated by the photodetector 51 are produced at equal increments of the center wavelength irradiating the sample.

The output signal from the photodetectors 25 is applied to an amplifier 61, which may include logarithmic amplification, and which applies the amplified signal to a high speed analog-to-digital converter 63. The sample pulses generated by the photodetector 51 are applied to a sequencer 65, which controls the analog-to-digital converter 63 to convert the analog output signal of the amplifier 61 to a binary value four times in rapid succession. The binary values produced by the analog-to-digital converter 63 are applied to an accumulator 66 wherein each set of four binary values produced by the analog-to-digital converter 63 in response to a sampling pulse from the photodetector 51 are added together and stored. The sum of the four successive binary values stored in the accumulator is divided by four and the quotient applied to a serializer 68. Since the summed value stored in the accumulator 66 is in binary, the division by four is carried out simply by decreasing the significance of each bit position by two. In other words, the bit in the $2^2$ position in the accumulator is applied to the $2^0$ position in the serializer, the bit in the $2^3$ position is applied to the $2^1$ bit position, the $2^4$ bit position is applied to the $2^2$ bit position, etc. After the division, the two least significant bits are discarded. The serializer 68 also receives pulses from a clock pulse source 69 and, in response to these pulses, under the control of the sequencer 65, applies the bits of the stored binary value in series to a computer 70. In this manner, a binary value representing the average of four successive conversions taken in rapid succession is applied to the computer and one of these average binary values is applied to the computer for each output sampling pulse produced by the photodetector 51.

Each time the sequencer 65 enables the serializer 68 to cause it to apply the binary average value to the computer 70, it also applies a signal pulse over channel 74 to the computer 70, which counts the signal pulses applied on channel 74. The count of pulses received on channel 74 maintained by the computer 70 is referred to as the SAMPLE COUNT. The computer 70 also receives a reset pulse from a pulse generator 76 on the optical index wheel 43, once for each revolution of the optical index wheel 43 and resets the SAMPLE COUNT to zero in response to each reset pulse received. The computer 70 has mapped in its random access memory 71 a set of storage locations equal in number to the number of sample pulses that will be generated by the photodetector 51 in one revolution of the optical index wheel. Each storage location will thus uniquely correspond to one of the optical index marks on the optical index wheel 43 and each value of the SAMPLE COUNT will correspond uniquely to one optical index mark on the index wheel 43 and one storage location in the random access memory 71. The computer 70, in response to receiving a start signal from a control panel 76, will first set the binary values in the storage locations mapped in the random access memory 71 to zero and then each binary value received from the serializer 68 will be added to the value stored in the storage location corresponding to and selected by the SAMPLE COUNT. The first revolution of the optical index wheel will cause each binary value received from the serializer 68 to be stored in its corresponding storage location in the random access memory as selected by the SAMPLE COUNT. In subsequent revolutions of the optical index wheel, the received binary values produced in response to the same optical index mark will be added to the binary value already stored in the corresponding storage location and the process is repeated for 20 revolutions of the index wheel. In this manner, the computer 70 averages the received binary values from the serializer 68 for each sampling position of the index wheel over 20 successive scans of the sample. Since successive binary values added together in the same storage location of the random access memory are all produced in response to the same optical index mark on the optical index wheel, the successive binary values represent reflected intensities resulting from irradiation of the sample with the same narrow wavelength band.

Thus, in accordance with the invention, two averaging steps are carried out. First, the accumulator 66 averages each set of four successive values which are converted in rapid succession by the analog-to-digital converter. Then the computer 70 averages these average values over 20 cycles of the index wheel. In this manner, a highly accurate digital value is obtained representing the reflectivity of the sample for each narrow wavelength band irradiating the sample corresponding to an optical index mark.

In the sequencer 65, each sampling pulse produced by the photodetector 51 is applied to a one-shot multivibrator 101 triggering it to produce an output pulse and is also applied to a counter 103 to set the counter 103 to a predetermined start count. The sampling pulse produced by the photodetector 51 is also applied to a register 105 in the serializer 68 to cause it to store the sum of the last four binary values added together in the accumulator 66, divided by four. The sum of the last four binary values is stored in the accumulator in a register 111, which continuously applies binary signals representing the stored value to the register 105.

When the counter 103 is set to its start count, it applies an enable signal to a counter 107 in the serializer 68. The counter 107, in response to being enabled by the enable signal, begins counting clock pulses from the clock pulse generator 69. The count in the counter 107 is applied in the serializer 68 to a multiplexer 109 which, as the count in the counter 107 is incremented, gates the binary values stored in the register 105 out in sequence over the output data line to the computer 70. In this manner, the binary value stored in the register 105 is read out serially to the computer 70. The clock pulses from the clock pulse generator 69 are also applied to the computer 70 through a gate 110 to strobe the serial binary bits into the computer 70. The gate 110 will be enabled by the enable signal from the counter 103 only when the counter 107 is enabled. When all of the binary values have been read out, the count in the counter 107 will reach a predetermined value at which it stops counting clock pulses until it receives another enableing signal from the counter 103. In this manner, in response to each sampling pulse from the photodetector 51, the previously averaged digital value stored in the accumulator 66 is applied to the register 105 and read out in series to the computer 70.

An output pulse produced by the one-shot 101 in response to being triggered by a sample pulse is applied in the accumulator 66 to the register 111 which, in response to the received pulse, sets the value in the register 111 to zero. In this manner, the initial value in the register 111 is set to zero prior to the first conversion by the analog-to-digital converter 63 upon receipt of a sampling pulse. An output pulse produced by the one-shot 101 in response to being triggered is also applied to a one-shot 113 which, in response to the trailing edge of the applied pulse, is triggered to produce an output pulse. The latter output pulse is applied to the enabling input of the analog-to-digital converter 63 to cause it to begin converting the analog signal applied by the amplifier 61 to a binary value.

When the analog-to-digital converter 63 has completed its analog-to-digital conversion, it produces a status signal on output channel 115 which is applied to the counter 103 to increment the counter 103 and is also applied to a one-shot multivibrator 117, which, if not disabled, is triggered by the status signal to produce an output pulse. The output pulse from the one-shot 117 is applied to the register 111 to cause the register 111 to store the digital value applied thereto by a binary adder 119 in the accumulator 66. The adder 119 receives the binary output value produced by the analog-to-digital converter 63 and the digital value stored in the register 111, adds these two values together, and applies the sum of the two values to the register 111. Thus, when the analog-to-digital converter 63 completes a conversion and produces a status signal on output channel 115, the one-shot 117 will cause the digital output value from the converter 63 to be added to the value in the register 111 and the resuling sum stored in the register 111. Since the value in the register 111 will be zero at the time of the first conversion, the first value stored in the register 111 will simply be the first output digital value produced by the analog-to-digital converter 63 in response to the sequencer 65 receiving a sampling pulse.

The ouput pulse produced by the one-shot 117 is also applied to the one-shot 113 and will cause the one-shot 113 to be triggered, which then again applies a pulse to the enabling input of the analog-to-digital converter 63 to cause it to begin a second conversion of the applied analog signal from the amplifier 61. The process then repeats and each successive digital value is added to the value stored in the register 111 and with each conversion, the counter 103 is incremented in response to the status signal produced by the converter 63 on channel 115. When the count in the counter 103 becomes incremented to a value four greater than the start value, it will disable the one-shot 117 so that the next status signal produced by the analog-to-digital converter 63 will not trigger the one-shot 117 and, as a result, only the first four successive values produced by the analog-to-digital converter following a sampling pulse from photodetector 51 will be summed and stored in the register 111.

The status pulse produced on channel 115 is also applied to an AND gate 121, which also receives the enable signal produced by the counter 103 when the counter 103 has its initial count registered therein in response to the applied sampling pulse from the photodetector 51. Thus, the status pulse produced by the analog-to-digital converter 63 upon completion of the first conversion is applied through the gate 121, the output of which is applied to channel 74 and, thus, the AND gate 121 will apply a pulse to the computer 70 on channel 74 at the time the analog-to-digital converter 63 produces the status pulse only once for each pulse applied from the photodetector 51. This pulse on channel 74 will be produced at the time of the first status pulse produced by the analog-to-digital converter 63 at the completion of the first analog-to-digital conversion. In this manner, the computer 70 receives one pulse from channel 74 for each sampling pulse produced by the photodetector 51 to increment the SAMPLE COUNT used by the computer 70 to select the storage location in which the received serialized digital value from the serializer is to be added. By the time the pulse on channel 74 ends, the binary value received serially from the serializer 68 will be complete, and the pulse on channel 74 is used to signal this fact to the computer.

It will be apparent from the above description that the electronic system comprising analog-to-digital converter 63, the sequencer 65, the accumulator 66 and the serializer 68 operate to supply one binary value to the computer for each sampling pulse received. As far as the computer is concerned, the binary value received can be operated on in the same manner as if it were produced by a single analog-to-digital conversion in response to the sampling pulse rather than the average of four successive analog-to-digital conversions. Thus, the use of the averaging circuitry between the optical system 10 and the computer 70 requires no change in the optical system 10 or in the computer. By performing the averaging over four successive values, the signal-to-noise ratio in the binary value is increased by a factor of two. Thus, this increased signal-to-noise ratio is achieved without requiring any change in the computer system or in the optical system.

As pointed out above, the optical system for generating the analog signal is exemplary only and the system can be readily adopted to used with other systems in which a sample is repeatedly scanned with narrow band wavelength light. In addition, it will be apparent that the invention is applicable to any system which produces a variable analog input signal and has particular application to those systems in which the analog signal is repeated a multiplicity of times. The applicant's invention, as applied to such systems, provides two averaging operations, once prior to the digital value being fed to the computer and, secondly, in the digital computer as the input analog value is successively repeated.

The above description is of preferred embodiments of the invention and many modifications may be made thereto without departing from the spirit and scope of the invention which defined in the claims.

We claim:

1. An analog-to-digital conversion and averaging system comprising a source of variable analog signals, a source of repeating sampling signals produced simultaneously with said analog signal, means responsive to each sampling signal to perform a plurality of successive analog-to-digital conversions on said analog signal prior to the next sampling signal produced by said source of sampling signals, and accumulator means to determine the sum of the successive conversions of each plurality of conversions produced in response to each sampling signal.

2. An analog-to-digital conversion and averaging system as recited in claim 1, wherein said means responsive to each sampling signal performs said conversions in rapid succession with each successive conversion being started immediately upon the completion of the preceeding conversion.

3. An analog-to-digital conversion and averaging system as recited in claim 1, wherein there is provided data processing means including storage means having a multiplicity of storage locations, each operable to store a digital value, means to apply to said data processing means a digital value corresponding to the sum produced by said accumulator means from each plurality of conversions to said data processing means, said data processing means operating to register the applied digital values in different storage locations of said storage means.

4. An analog-to-digital conversion and averaging system as recited in claim 3, wherein said analog signal is cyclically repeated and said source of sampling signals produces said sampling signals in synchronism with said repeating analog signal so that each sampling signal occurs at the same point in said repeating analog signal and wherein said data processing means accumulates in each storage location the sum of a set of digital values obtained in response to sampling signals produced at the same point in each repeating analog signal.

5. An optical analyzing instrument comprising an analog-to-digital converson and averaging system as recited in claim 4, and including an optical system for irradiating a sample with a narrow band wavelength which is scanned throughout a range of wavelengths and photodetecting means to receive light from said sample in response to the irradiation of said sample by said optical system, said photodetecting means comprising said source of an analog signal and producing said analog signal in response to the light received by said photodetecting means from said sample.

6. An optical analyzing instrument comprising an analog-to-digital conversion and averaging system as recited in claim 1, and including an optical system for irradiating a sample with narrow band wavelength light which is scanned through a range of wavelength and photodetecting means to receive light from said sample in response to irradiation of said sample by said optical system, said photodetecting means comprising said source of said analog signal and producing said analog signal in response to the light received by said photodetecting means from said sample.

7. An optical analyzing system as recited in claim 6, further comprising data processing means including a multiplicity of storage locations, means to apply to said data processing means a digital value corresponding to the sum produced by said accumulator means from each plurality of conversions produced by said conversion means in response to each sampling signal wherein a plurality of sets of digital values are applied to said data processing means, each set of digital values corresponding to a different narrow wavelength band with which said optical system irradiates said sample, said data processing means operating to accumulate the sum of digital values of each of said sets in a different storage location of said storage means.

8. A system as recited in claim 1, further comprising means to generate a time varying stimulus, said source of analog signals producing said analog signals in response to said time varying stimulus, said source of repeating sampling signals producing each of said sampling signals in a predetermined synchronism with said time varying stimulus.

9. A system as recited in claim 8, wherein said means to produce a time varying stimulus comprises means for irradiating a sample with a narrow band wavelength, which is scanned throughout a range of wavelengths, and wherein said source of analog signals comprises photodetecting means to receive light from said sample in response to the irradiation of said sample by said irradiating means.

10. A system as recited in claim 1, wherein the time intervals between adjacent ones of said sampling signals have a plurality of different durations.

11. An analog-to-digital conversion and averaging system as recited in claim 1, wherein said accumulator means comprises a register operable to store a digital number, means responsive to each sampling signal to set the value in said register to zero, and means to add each analog-to-digital conversion to the value stored in said register, said system further comprising a second register operable to store a digital number and circuit means to store the value in said first register in said second register after said accumulator means has determined the sum of the successive conversions in response to a sampling signal prior to said first register being set to zero in response to the next said sampling signal.

12. A system as recited in claim 11, wherein said circuit means comprises counting means to count the analog-to-digital conversions produced by said analog to digital convertor following each sampling signal and means storing the value accumulated in said first register into said second register in response to the count in said counting means reaching a predetermined value greater than 1.

* * * * *